(12) United States Patent
Stender et al.

(10) Patent No.: US 10,570,313 B2
(45) Date of Patent: Feb. 25, 2020

(54) DISHING REDUCING IN TUNGSTEN CHEMICAL MECHANICAL POLISHING

(71) Applicant: Air Products and Chemicals, Inc., Allentown, PA (US)

(72) Inventors: Matthias Stender, Phoenix, AZ (US); Blake J. Lew, Scottsdale, AZ (US); Xiaobo Shi, Chandler, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/014,210

(22) Filed: Feb. 3, 2016

(65) Prior Publication Data

US 2016/0237315 A1     Aug. 18, 2016

Related U.S. Application Data

(60) Provisional application No. 62/115,264, filed on Feb. 12, 2015.

(51) Int. Cl.
*C09G 1/02* (2006.01)
*C23F 1/26* (2006.01)
*H01L 21/321* (2006.01)
*B24B 37/20* (2012.01)
*C09G 1/04* (2006.01)
*C09K 3/14* (2006.01)

(52) U.S. Cl.
CPC ............... *C09G 1/02* (2013.01); *B24B 37/20* (2013.01); *C09G 1/04* (2013.01); *C09K 3/1445* (2013.01); *C09K 3/1463* (2013.01); *C23F 1/26* (2013.01); *H01L 21/3212* (2013.01)

(58) Field of Classification Search
None
See application file for complete search history.

(56) References Cited

U.S. PATENT DOCUMENTS

| 4,789,648 | A | | 12/1988 | Chow et al. |
| 5,097,071 | A | | 3/1992 | Immel et al. |
| 5,417,877 | A | * | 5/1995 | Ward ............... G03F 7/425 134/38 |
| 5,863,838 | A | | 1/1999 | Farkas et al. |
| 5,916,855 | A | | 6/1999 | Avanzino et al. |
| 5,958,288 | A | | 9/1999 | Mueller et al. |

(Continued)

FOREIGN PATENT DOCUMENTS

| EP | 0844290 A1 | 5/1998 |
| JP | 2006502579 | 1/2006 |

(Continued)

OTHER PUBLICATIONS

Yagishita, Atsushi, et al., High Performance Damascene Metal Gate MOSFETs for 0.1 um Regime, IEEE Transactions on Electron Devices, vol. 47, No. 5, May 2000.

(Continued)

*Primary Examiner* — Allan W. Olsen
(74) *Attorney, Agent, or Firm* — Lina Yang (57) ABSTRACT

This invention pertains to slurries, methods and systems that can be used in chemical mechanical planarization (CMP) of tungsten containing semiconductor device. Additives are used to reduce the dishing on large and small feature sizes (large bond pad as well as fine line structures) without retarding the tungsten removal rate.

5 Claims, 4 Drawing Sheets

(56) References Cited

U.S. PATENT DOCUMENTS

| | | | |
|---|---|---|---|
| 6,068,787 A | 5/2000 | Grumbine et al. | |
| 6,083,838 A | 7/2000 | Burton et al. | |
| 6,362,104 B1 | 3/2002 | Wang et al. | |
| 6,565,619 B1* | 5/2003 | Asano | C09G 1/02 106/3 |
| 6,776,810 B1 | 8/2004 | Cherian et al. | |
| 7,014,669 B2 | 3/2006 | Small et al. | |
| 7,029,508 B2 | 4/2006 | Scott et al. | |
| 7,077,880 B2 | 7/2006 | Siddiqui | |
| 7,247,567 B2 | 7/2007 | Vacassy et al. | |
| 7,427,305 B2 | 9/2008 | Scott et al. | |
| 7,429,338 B2 | 9/2008 | Siddiqui | |
| 8,492,276 B2 | 7/2013 | Abe et al. | |
| 8,858,819 B2 | 10/2014 | McConnell et al. | |
| 9,127,187 B1* | 9/2015 | Grumbine | C09G 1/02 |
| 9,343,326 B2 | 5/2016 | Kim et al. | |
| 9,401,104 B2* | 7/2016 | Lau | G09G 1/02 |
| 9,631,122 B1* | 4/2017 | Dockery | B24B 37/24 |
| 2003/0162399 A1* | 8/2003 | Singh | C09G 1/02 438/692 |
| 2003/0168627 A1* | 9/2003 | Singh | C09G 1/02 252/79.1 |
| 2004/0029495 A1 | 2/2004 | Small et al. | |
| 2004/0060502 A1* | 4/2004 | Singh | C09G 1/02 117/68 |
| 2004/0077295 A1* | 4/2004 | Hellring | C09G 1/02 451/41 |
| 2004/0082274 A1* | 4/2004 | Leng | H01L 21/3212 451/41 |
| 2004/0092102 A1* | 5/2004 | Li | C09G 1/04 438/689 |
| 2004/0148867 A1 | 8/2004 | Matsumi | |
| 2004/0161932 A1* | 8/2004 | Matsui | C09G 1/02 438/689 |
| 2004/0175949 A1* | 9/2004 | Lee | C04B 41/009 438/691 |
| 2005/0108949 A1 | 5/2005 | Matsuda et al. | |
| 2005/0164510 A1* | 7/2005 | Ikeda | C09G 1/02 438/692 |
| 2005/0178742 A1* | 8/2005 | Chelle | C09G 1/02 216/88 |
| 2005/0194358 A1* | 9/2005 | Chelle | B24B 37/044 216/88 |
| 2006/0278614 A1* | 12/2006 | Wang | H01L 21/3212 216/89 |
| 2008/0020680 A1 | 1/2008 | Vacassy et al. | |
| 2008/0032606 A1 | 2/2008 | Liu et al. | |
| 2008/0085602 A1* | 4/2008 | Seong | C09G 1/02 438/693 |
| 2008/0149591 A1 | 6/2008 | Siddiqui et al. | |
| 2008/0242090 A1 | 10/2008 | Yamada et al. | |
| 2009/0165395 A1* | 7/2009 | Ikeda | C09G 1/02 51/309 |
| 2010/0252774 A1* | 10/2010 | Shida | C09K 3/1409 252/79.1 |
| 2011/0124195 A1* | 5/2011 | Park | C09G 1/02 438/693 |
| 2011/0240594 A1* | 10/2011 | Hamaguchi | G11B 5/8404 216/22 |
| 2012/0238094 A1* | 9/2012 | Minami | B24B 37/044 438/693 |
| 2014/0199841 A1* | 7/2014 | Noller | C09K 3/1463 438/693 |
| 2014/0273458 A1 | 9/2014 | Shi et al. | |
| 2015/0184028 A1* | 7/2015 | Jung | C09G 1/02 438/692 |
| 2015/0259804 A1* | 9/2015 | Lin | H01L 21/3212 438/693 |
| 2015/0267083 A1* | 9/2015 | Ward | C09G 1/02 438/693 |
| 2015/0315417 A1* | 11/2015 | Lau | B24B 37/04 216/53 |
| 2016/0122590 A1* | 5/2016 | Lew | C09G 1/02 438/693 |
| 2016/0200944 A1* | 7/2016 | Zhou | H01L 21/30625 438/693 |
| 2016/0251547 A1* | 9/2016 | Park | C09G 1/02 252/79.4 |
| 2017/0037278 A1* | 2/2017 | Masuda | H01L 21/02024 |
| 2019/0051537 A1* | 2/2019 | Peng | H01L 21/3212 |

FOREIGN PATENT DOCUMENTS

| | | |
|---|---|---|
| JP | 2008288537 | 11/2008 |
| JP | 2010129941 | 10/2010 |
| WO | 2006076857 A1 | 7/2006 |
| WO | 2011093195 | 8/2011 |
| WO | 2015138295 A1 | 9/2015 |

OTHER PUBLICATIONS

Walling, Cheves, Free Radicals in Solution, 1916—New York, Wiley (1957), pp. 564-579.

Bacon, R. G. R., The Initiation of Polymerization Processes by Redox Catalysts, Quarterly Reviews, vol. IX, (1955), pp. 287-310.

* cited by examiner

DISHING REDUCING IN TUNGSTEN CHEMICAL MECHANICAL POLISHING

CROSS REFERENCE TO RELATED APPLICATIONS

This application claims priority to U.S. provisional application 62/115,264 filed on Feb. 12, 2015, the entire contents of which is incorporated herein by reference thereto for all allowable purposes.

BACKGROUND

This invention pertains to slurries, systems and methods used for Chemical Mechanical Polishing or Planarization (CMP) of semiconductor devices, particularly for materials containing tungsten.

Integrated circuits are interconnected through the use of well-known multilevel interconnections. Interconnection structures normally have a first layer of metallization, an interconnection layer, a second level of metallization, and typically third and subsequent levels of metallization. Interlevel dielectric materials such as silicon dioxide and sometimes low-k materials are used to electrically isolate the different levels of metallization in a silicon substrate or well. The electrical connections between different interconnection levels are made through the use of metallized vias and in particular tungsten vias. U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metallized vias or contacts are formed by a blanket tungsten deposition followed by a CMP step. In a typical process, via holes are etched through the interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by CMP to form metal vias.

In another semiconductor manufacturing process, tungsten is used as a gate electrode material in the transistor because of its superior electrical characteristics over polysilicon which has been traditionally used as gate electrode material, as taught by A. Yagishita et al, IEEE TRANSACTIONS ON ELECTRON DEVICES, VOL. 47, NO. 5, MAY 2000.

In a typical CMP process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a polishing "slurry", a polishing "composition" or a polishing "formulation", is deposited onto the pad during polishing, where rotation and/or movement of the pad relative to the wafer brings said slurry into the space between the polishing pad and the substrate surface. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. Removal of tungsten in the CMP is believed to be due to synergy between mechanical abrasion and tungsten oxidation followed by dissolution.

One of the commonly encountered problems in CMP in particular in metal applications such as tungsten is dishing. Tungsten CMP slurries have to be formulated such that the dishing can be minimized in order to meet certain design targets critical for a functioning device. In tungsten applications, a certain resistivity is needed for the device to function as designed which required a certain remaining tungsten thickness after the CMP step. If the dishing is too high the remaining W thickness will be too low therefore the resistivity will be too high.

U.S. Pat. No. 6,776,810 describes the use of positively charged polyelectrolytes with a molecular weight of 15,000 or more for the use in CMP slurries with silica or alumina particles for the use on metallic substrates. A variety of different cationic homo- and co-polymers are mentioned in this patent.

U.S. Pat. No. 7,247,567 describes a method of chemically-mechanically polishing a substrate comprising tungsten through use of a composition comprising a tungsten etchant, an inhibitor of tungsten etching, and water, wherein the inhibitor of tungsten polishing is a polymer, copolymer, or polymer blend comprising at least one repeating group comprising at least one nitrogen-containing heterocyclic ring or a tertiary or quaternary nitrogen atom. The invention further provides a chemical-mechanical polishing composition particularly useful in polishing tungsten-containing substrates.

For example, U.S. Pat. No. 8,858,819 describes the use of (polyalkyleneimine), a polymer with a large positive charge density, as an inhibitor in tungsten slurries.

U.S. Pat. No. 8,492,276 describes the use of cationic water-soluble polymers for the use in acidic (pH 1-3) tungsten slurries. A variety of different types of cationic polymers are listed and the formulations were evaluated on patterned wafers. Good performance on topography was reported, however no specific dishing values are provided.

U.S. Pat. No. 6,083,838 describe adding surfactant to CMP slurries to planarize a metal and in particular tungsten surface. In one embodiment, the method comprises selecting a slurry that contains conventional components of an abrasive and an oxidant. The oxidant is known to have a known rate of oxidation and is capable of oxidizing the metal. This embodiment further comprises reducing a rate of exposure of the metal to the oxidant by altering a property of the slurry, oxidizing the metal at the reduced rate to form an oxide of the metal, and removing the oxide with the abrasive to produce a planarized surface of the semiconductor wafer.

There still has been a need for novel CMP slurries, particularly neutral pH tungsten slurries that can reduce dishing while maintain desirable removal rate in polishing.

SUMMARY

The present invention relates to CMP slurries, system and method of using the CMP slurries to reduce dishing while maintain desirable removal rate in polishing semiconductor device or substrate. More specifically, the present invention relates to CMP slurries, system and method of using the CMP slurries to reduce dishing while maintain desirable removal rate in polishing semiconductor device or substrate that containing tungsten.

In one aspect, described herein is a polishing composition comprising:
abrasive;
at least one oxidizing agent;
activator;
an additive;
pH adjusting agent; and
remaining being water;
wherein the pH of the slurry is between 1 and 14, preferably is between 2 and 10, more preferably is between 3 and 9, and most preferably is between 6 and 8.

In another aspect, described herein is a system for is a system for chemical mechanical planarization, comprising:
   a semiconductor substrate comprising at least one surface containing tungsten;
   a polishing pad; and
   a polishing composition comprising:
      abrasive, at least one oxidizing agent, activator, an additive, pH adjusting agent, and remaining being water; wherein the pH of the slurry is between 1 and 14, preferably is between 2 and 10, more preferably is between 3 and 9, and most preferably is between 6 and 8;
   wherein the at least one surface containing tungsten is in contact with the polishing pad and the polishing composition.

In yet another aspect, described herein is a polishing method for chemical mechanical planarization of a semiconductor substrate comprising at least one surface containing tungsten, comprising the steps of:
   a) contacting the at least one surface containing tungsten with a polishing pad;
   b) delivering a polishing composition to the surface, the polishing composition comprising:
   c) abrasive, at least one oxidizing agent, activator, an additive, pH adjusting agent, and remaining being water; wherein the pH of the slurry is between 1 and 14, preferably is between 2 and 10, more preferably is between 3 and 9, and most preferably is between 6 and 8;
   and
   C) polishing the at least one surface containing tungsten with the polishing composition.

The abrasive includes, but is not limited to colloidal silica, fumed silica, alumina, titania, ceria, zirconia, surface modified particles selected from the group consisting of activator-containing particles and composite particles, lattice doped inorganic oxide particles; and combinations thereof; and combinations thereof.

The concentration of abrasive can range from 0.01 wt % to 30 wt %, the preferred is from about 0.05 wt % to about 10 wt %, the more preferred is from about 0.1 and 2 wt %. The weight percent is relative to the composition weight.

The oxidizing agent includes, but is not limited to peroxy compound selected from the group consisting of hydrogen peroxide, urea peroxide, peroxyformic acid, peracetic acid, propaneperoxoic acid, substituted or unsubstituted butaneperoxoic acid, hydroperoxy-acetaldehyde, potassium periodate, ammonium peroxymonosulfate; and non-peroxy compound selected from the group consisting of ferric nitrite, $KClO_4$, $KBrO_4$, $KMnO_4$.

The oxidizer concentration can range from 0.01 wt % to 30 wt % while the more preferred amount of oxidizing agents is from about 0.5 wt % to about 10 wt %. The weight percent is relative to the composition.

The activator includes, but is not limited to, (1) inorganic oxide particle with transition metal coated onto its surface, where the transition metal is selected from the group consisting of iron, copper, manganese, cobalt, cerium, and combinations thereof; (2) soluble catalyst includes, but is not limited to ammonium iron (III) oxalate trihydrate, iron (III) citrate tribasic monohydrate, iron(III) acetylacetonate and ethylenediamine tetraacetic acid, iron (III) sodium salt hydrate, a metal compound having multiple oxidation states selected from the group consisting of Ag, Co, Cr, Cu, Fe, Mo, Mn, Nb, Ni, Os, Pd, Ru, Sn, Ti, V; and combinations thereof.

The amount of activator in a slurry ranges from about 0.0005 wt % to about 10 wt %; preferably 0.001 wt % to 2 wt %, more preferably between 0.01 wt % to 1 wt %; most preferably between 0.05 wt % to 0.5 wt %.

The additive includes, but is not limited to sarcosinate, sarcosinate related carboxylic compound, and hydrocarbon substituted sarcosinate; organic polymer and copolymer having molecules containing ethylene oxide repeating units, such as polyethylene oxide (PEO), and ethoxylated surfactant.

The general amount of additive ranges from 0.1 to 10,000 ppm, preferably 1 ppm to 1000 ppm, more preferably 10 to 500 ppm.

The sarcosinates, sarcosinate related carboxylic compounds, and hydrocarbon substituted sarcosinate can be present at a concentration of 0.1 to 1000 ppm, preferably 1 to 500 ppm and more preferably 10 to 250 ppm.

Example of sarcosinate includes but is not limited to oleoyl sarcosinate, N-Lauroylsarcosinate.

The amount of polyethylene oxide (PEO) and ethoxylated surfactants range from 1 ppm to 10,000 ppm, preferably 10 ppm to 1000 ppm, and more preferably 50 to 500 ppm.

The pH adjusting agent includes, but is not limited to amine, ammonium hydroxide, potassium hydroxide, nitric acid, phosphoric acid, sulfuric acid, organic acid, and/or salt thereof, and any combination thereof.

The pH of the composition is desirably on the order of from about pH 4 to about pH 10, and preferably from about pH 5 to about pH 9, and more preferably from about pH 6 to about pH 8.

The polishing composition may further comprise biocide ranging from about 0.0001 weight % to about 0.03 weight %.

The polishing composition optionally comprises surfactant; stabilizing and passivating agent; dispersion agent; chelator; film-forming anticorrosion agent; and a polish enhancement agent.

Other aspects, features and embodiments of the invention will be more fully apparent from the ensuing disclosure and appended claims.

BRIEF DESCRIPTION OF THE DRAWINGS

The present invention will hereinafter be described in conjunction with the appended figures wherein like numerals denote like elements.

DETAILED DESCRIPTION

It can be seen that previous works done to reduce dishing or generally improve performance on patterned wafers had been focused on cationic polymeric additives which proved to be very useful in acidic slurries. However, these cannot be used in neutral pH tungsten slurries as it would lead to unstable formulation due to the negatively charged silica particles at the neutral pH. Therefore there is a need for slurries which can reduce the dishing of large bond pad features as well as fine line structures without retarding the tungsten removal rate.

Present invention pertains to slurries that can be used in chemical mechanical planarization (CMP) of tungsten containing semiconductor devices, substrates, or films. CMP slurries of present invention provide the unique result of reduced dishing on large features and/or small lines depending on desired application without a decrease in tungsten removal rate.

The CMP slurries comprise abrasive, one or more oxidizing agents (i.e., an oxidizer that is not a free radical producer), activator or catalyst, an additive to reduce dishing, pH adjusting agent, and remaining being water. The pH of the slurry is between 1 and 14, preferably is between 2 and 10, more preferably is between 3 and 9, and most preferably is between 6 and 8.

The CMP slurries may as well contain surfactant; stabilizing and passivating agents; dispersion agents; chelators; film-forming anticorrosion agents; and a polish enhancement agent.

Abrasive

The abrasive used in CMP slurries can be activator-containing particles (i.e., an abrasive having an activator coating); or non-activator-containing particles.

The abrasive is generally in the form of an abrasive particle, and typically many abrasive particles, of one material or a combination of different materials. Generally, a suitable abrasive particle is more or less spherical and has an effective diameter of about 30 to about 300 nanometers (nm), although individual particle size may vary. Abrasive in the form of aggregated or agglomerated particles are preferably processed further to form individual abrasive particles.

A slurry may have more than one type of abrasive, and it may be advantageous to have different sizes for different types of abrasives.

Abrasive can be metal oxide, metalloid oxide or a chemical mixture of metal oxides or metalloid oxides.

Suitable metal oxide abrasive includes, but is not limited to, alumina, ceria, germania, silica, spinel, titania, an oxide or nitride of tungsten, zirconia, or any of the above doped with one or more other minerals or elements, and any combination thereof. The metal oxide abrasive may be produced by any of a variety of techniques, including sol-gel, hydrothermal, hydrolytic, plasma, pyrogenic, aerogel, fuming and precipitation techniques, and any combination thereof.

Precipitated metal oxides and metalloid oxides can be obtained by known processes by reaction of metal salts and acids or other precipitating agents. Pyrogenic metal oxide and/or metalloid oxide particles are obtained by hydrolysis of a suitable, vaporizable starting material in a oxygen/hydrogen flame. An example is pyrogenic silicon dioxide from silicon tetrachloride. The pyrogenic oxides of aluminum oxide, titanium oxide, zirconium oxide, silicon dioxide, cerium oxide, germanium oxide and vanadium oxide and chemical and physical mixtures thereof are suitable.

The abrasive may be a mixed oxide such as consisting of the two molecular species $SiO_2$ and $Al_2O_3$. Abrasives comprising alumina coated silica can also be useful.

In one preferred embodiment, the metal oxide abrasive is a precipitated or fumed abrasive, and preferably a fumed abrasive. By way of example, a fumed metal oxide abrasive may be a fumed silica or fumed alumina or a fumed silica/alumina.

Silica is the preferred abrasive. The silica can be any of precipitated silica, fumed silica, silica fumed, pyrogenic silica, silica doped with one or more adjutants, or any other silica-based compound.

In an alternate embodiment the silica can be produced, for example, by a process selected from the group consisting of a sol-gel process, a hydrothermal process, a plasma process, a fuming process, a precipitation process, and any combination thereof.

The silica in one embodiment is advantageously at a particle size between about 2 and about 300 nanometers, for example between about 30 and about 250 nanometers. Particles with mean particle size larger than 100 nm, or preferably more than 150 nm are preferred as they would provide very high removal rates in CMP at the same abrasive particle concentration in terms of wt %.

Abrasive particles may be purified using suitable method such as ion exchange to remove metal impurities that may help improve the colloidal stability. Alternatively high purity abrasive particles are used.

In general, the above-mentioned abrasives may be used either alone or in combination with one another. Two or more abrasive particles with different sizes may also be combined to obtain excellent performance.

In most embodiments of the present invention, the abrasive is selected from the group consisting of colloidal silica; fumed silica; alumina; titania; ceria; zirconia; surface modified particles selected from the group consisting of activator-containing particles and composite particles, lattice doped inorganic oxide particles; and combinations thereof.

The concentration of abrasive can range from 0.01 wt % to 30 wt %, the preferred is from about 0.05 wt % to about 10 wt %, the more preferred is from about 0.1 and 2 wt %. The weight percent is relative to the composition weight.

Additive

The CMP slurries of the present invention comprise additives that can reduce the dishing for tungsten polishing.

Additives used in the slurries include, but are not limited to (1) sarcosinates, related carboxylic compounds, and hydrocarbon substituted sarcosinate; (2) organic polymer and copolymer having molecules containing ethylene oxide repeating units, such as polyethylene oxide (PEO); and (3) Ethoxylated surfactants.

The suitable sarcosinates include, but are not limited to, cocoyl, lauroyl, myristoyl, oleoyl, and stearoyl sarcosinate.

The suitable sarcosinates related carboxylic compounds include, but are not limited to, unsaturated salts of fatty acids such as myristoleic, palmitoleic, sapienic, oleic, elaidic, vaccenic, linoleic, linoelaidic, α-linolenic, arachidocnic, eicosapentaenoic, erucic and decosahexaenoic acid; and salts of saturated fatty acids such as sodium, potassium, or ammonia salts of stearate, caprylic, capric, lauric, myristic, palmitic, stearic, arachidic, behenic, lignoceric and cerotic acid.

The suitable hydrocarbon substituted sarcosinate has a substituent includes, but is not limited to, an alkyl, alkenyl or alkynyl, having ranging from 1 carbon atom for the alkyl substituent, 2 carbon atoms for the alkenyl, or 3 up to 24 carbon atoms for alkynyl substituent. The number of double bonds for the alkenyl substituent or the number of triple bonds for the alkynyl substituent can be up to 4.

The sarcosinates, related carboxylic compounds, and hydrocarbon substituted sarcosinate can be present at a concentration of 0.1 to 5000 ppm, more preferred 1 to 500 ppm and most preferred 10 to 250 ppm.

The suitable organic polymer and copolymer have molecules containing ethylene oxide repeating units, includes Polyoxyethylene (POE). Polyoxyethylene (POE), is also called polyethylene oxide (PEO), or polyethylene glycol (PEG). The three names are chemically synonymous, but historically PEG has tended to refer to oligomers and polymers with a molecular mass below 20,000 g/mol, PEO to polymers with a molecular mass above 20,000 g/mol, and POE to a polymer of any molecular mass.

An example is polyethylene oxide (PEO), having the general molecular structure of wherein n refers to the total numbers of the repeating unit ranging from 4 to 113636; and the molecular weights (grams/mole) ranging from 200 to 5,000,000. A preferred range is from 1000 to 1000000; and the most preferred concentration range is from 10000 to 400000.

The ethoxylated surfactants are compounds that contain hydrophobic part as for example a hydrocarbon or polypropylene oxide chain as well as hydrophilic part which is the polyethylene oxide chain.

The suitable ethoxylated surfactants include, but are not limited to ethoxylated non-ionic surfactant, such as alkyl phenol ethoxylate, fatty alcohol ethoxylate, fatty amine ethoxylate, propylene glycol (PPG)-ethylene glycol (PEG) block copolymers and polyether silicone surfactants. Preferred type of ethoxylated surfactants include block polymers comprising PEG and PPG groups; ethoxylated fatty alcohols and polyether silicone surfactants.

The propylene glycol (PPG)-ethylene glycol (PEG) block polymers comprise blocks of different polymerized monomers. Preferred block polymers comprise polymers made with PEG and PPG monomers. Suitable block polymers may include polymers with PEG and PPG blocks can be arranged in different orders such as PEG-PPG-PEG, PPG-PEG-PPG. PEG/PEP molar ratios in the block copolymer may range from 1:99 to 99:1. Molecular weight of the block copolymers can range from 500 to 50000, preferably between 1000 and 10000. Examples of PEG-PPG block polymers include but not limited to Pluronic™ family of block copolymers from BASF chemicals such as Pluronic™ 10 R5, L81, L61, L31, L92, L72, L62, L42, P94, P84, P64, L64, L44, P85, P75, P65, L35, F87, F77, F98, F88, F68 and F38; and Synperonic PE series surfactants.

Fatty alcohol ethylates are non ionic surfactants which comprise both hydrophobic tail portion (fatty alcohol part) and hydrophilic polar head groups (ethoxy chain part), and are thus tend to dissolve in both aqueous and oil phase and to reduce the surface tension of liquids. The hydrophobic portion of the surfactant molecules may comprise organic group comprising 6 or more carbon atoms, or more preferably 8 or more carbon atoms. The molar ratio of ethoxylate groups to the hydrophobic group may be between 7 and 25, more preferably between 9 and 22.

A silicone surfactant is comprised of two dissimilar components, a non polar-hydrophobic silicone portion, and a polar-hydrophilic polyether portion. Polyether portion may comprise polyethylene oxide polymer or a copolymer of polyethylene oxide and polypropylene oxide. Examples of silicone polyether surfactants include DABCO™ series surfactants from Air Products & Chemicals and Tegopren™ series surfactants from Evonik Industries Two basic types of silicone polyether surfactants can be prepared dependent upon the type of bond between the siloxane and polyether. When the bond is between the silicone atom on the backbone and the carbon atom of the polyether (Si—C), the copolymer is considered non hydrolyzable. When the bond is between the silicone atom and an oxygen atom on the polyether (Si—O—C), the molecule is considered hydrolyzable and susceptible to cleavage in acid or basic medium. Many of the surfactants produced commercially are of the non hydrolyzable form. The general molecular structure for a non hydrolyzable silicone surfactants can be represented by the structure in FIG. 4.

The amount of polyethylene oxide (PEO) and ethoxylated surfactants range from 1 ppm to 10,000 ppm, more preferred 10 ppm to 1000 ppm, and most preferred 50 to 500 ppm Oxidizer The CMP slurries of the present invention comprise an oxidizer for chemical etching of material. The oxidizing agent of the CMP slurry is in a fluid composition which contacts the substrate, and assists in the chemical removal of targeted material on the substrate surface. The oxidizing agent component is thus believed to enhance or increase the material removal rate of the composition. Preferably, the amount of oxidizing agent in the composition is sufficient to assist the chemical removal process, while being as low as possible to minimize handling, environmental, or similar or related issues, such as cost.

Advantageously, in one embodiment of this invention, the oxidizer is a component which will, upon exposure to at least one activator, produce free radicals giving an increased etching rate on at least selected structures. The free radicals described infra will oxidize most metals, and will make the surface more susceptible to oxidation from other oxidizers. However, oxidizers are listed separately from the "Compound Producing Free Radicals", to be discussed infra, because some oxidizers do not readily form free radicals when exposed to the activators, and in some embodiments it is advantageous to have one or more oxidizers which provide matched etching or preferential etching rates on a variety of combinations of metals which may be found on a substrate.

As is known in the art, some oxidizers are better suited for certain components than for other components. In some embodiments of this invention, the selectivity of the CMP system to one metal as opposed to another metal is maximized, as is known in the art. However, in certain embodiments of present invention, the combination of oxidizers is selected to provide substantially similar CMP rates (as opposed to simple etching rates) for a conductor and a barrier combination.

In one embodiment, the oxidizing agent is an inorganic or organic per-compound.

A per-compound is generally defined as a compound containing an element in its highest state of oxidation, such as perchloric acid; or a compound containing at least one peroxy group (—O—O—), such as peracetic acid and perchromic acid.

Suitable per-compounds containing at least one peroxy group include, but are not limited to, peracetic acid or salt thereof, a percarbonate, and an organic peroxide, such as benzoyl peroxide, urea hydrogen peroxide, and/or di-t-butyl peroxide.

Suitable per-compounds containing at least one peroxy group include peroxides. As used herein, the term "peroxides" encompasses R—O—O—R', where R and R' are each independently H, a $C_1$ to $C_6$ straight or branched alkyl, alkanol, carboxylic acid, ketone (for example), or amine, and each of the above can independently be substituted with one or more benzyl group (for example benzoyl peroxide) which may themselves be substituted with OH or $C_1$-$C_5$ alkyls, and salts and adducts thereof. This term therefore includes common examples such as hydrogen peroxide, peroxyformic acid, peracetic acid, propaneperoxoic acid, substituted or unsubstituted butaneperoxoic acid, hydroperoxy-acetaldehyde, Also encompassed in this term are common complexes of peroxides, for example urea peroxide.

Suitable per-compounds containing at least one peroxy group include persulfates. As used herein, the term "persulfates" encompasses monopersulfates, di-persulfates, and acids and salts and adducts thereof. Included for example is peroxydisulfates, peroxymonosulfuric acid and/or peroxymonosulfates, Caro's acid, including for example a salt such as potassium peroxymonosulfate, but preferably a non-metallic salt such as ammonium peroxymonosulfate.

Suitable per-compounds containing at least one peroxy group include perphosphates, defined as above and including peroxydiphosphates.

Also, ozone is a suitable oxidizing agent either alone or in combination with one or more other suitable oxidizing agents.

Suitable per-compounds that do not contain a peroxy group include, but are not limited to, periodic acid and/or any periodiate salt (hereafter "periodates"), perchloric acid and/or any perchlorate salt (hereafter "perchlorates") perbromic acid and/or any perbromate salt (hereafter "perbromates"), and perboric acid and/or any perborate salt (hereafter "perbromates").

Other oxidizing agents are also suitable components of the composition of the present invention. Iodates are useful oxidizers.

Two and more oxidizers may also be combined to obtain synergistic performance benefits.

The oxidizer concentration can range from 0.01 wt % to 30 wt % while the more preferred amount of oxidizing agents is from about 0.5 wt % to about 10 wt %. The weight percent is relative to the composition.

In most embodiments of the present invention, the oxidizer is selected from the group consisting of peroxy compound selected from the group consisting of hydrogen peroxide, urea peroxide, peroxyformic acid, peracetic acid, propaneperoxoic acid, substituted or unsubstituted butaneperoxoic acid, hydroperoxy-acetaldehyde, potassium periodate, ammonium peroxymonosulfate; and non-per-oxy compound selected from the group consisting of ferric nitrite, $KClO_4$, $KBrO_4$, $KMnO_4$.

Activator

The activator or catalyst, is a material that facilitates the formation of free radicals by at least one free radical-producing compounds present in the fluid. If the activator is a metal ion, or metal-containing compound, it is in a thin layer associated with a surface of a solid which contacts the fluid. If the activator is a non-metal-containing substance, it can be dissolved in the fluid. It is preferred that the activator is present in amount that is sufficient to promote the desired reaction.

Generally, light-activated activators such as titanium oxides (and light used as an activator) are not preferred. There is no method to get light at the desired concentration between a pad and a substrate. The activator must therefore be pre-activated, and/or the free radicals must be formed, before the fluid passes between a pad and a substrate.

In some configurations use of photo-activated activator is acceptable. For example, for long-lived free radicals, i.e., with an average life in solution of a tenth of a second or more, the photoactivator can be a matrix containing activator that the fluid must contact just before passing between a pad and a substrate. A bed of activator can for example be placed immediately upstream of the fluid outlet, so that free radicals formed have not totally degraded before passing between the pad and the substrate. The photoactivated materials of U.S. Pat. No. 6,362,104, the disclosure of which is incorporated by reference, can be used in this capacity. These include $TiO_2$ and $Ti_2O_3$, as well as to the less preferred oxides of Ta, W, V, and Nb.

The activator may be a non-metal-containing compound. Iodine is a useful with for example hydrogen peroxide to form free radicals. The iodine may be present in an amount sufficient to create the desired free radical activity. In some embodiments, the iodine may be present in an amount ranging from about 1 ppm to about 5000 ppm, preferably between about 10 ppm and about 1000 ppm. Non-metallic activators are often synergistically combined with metal-containing activators.

The activator can also be a metal-containing compound, in particular a metal selected from the group consisting of the metals known to activate a Fenton's Reaction process in hydrogen peroxide.

Advantageously, most metal-containing activators are associated with a solid as discussed below. Of course, the system of this invention may optionally comprises both metal-containing activators and non-metal-containing activators, where the non-metal-containing activators are in solution in the fluid and where at least a portion of the metal-containing activators are associated with a solid.

In another embodiment, the activator is any metal-containing compound known to be useful in Fenton's reactions as an activator, wherein the oxidizer is a peroxide, particularly hydrogen peroxide. Transition metals like copper, manganese, cobalt, and cerium, as well as the more traditional iron and copper, are able to catalyze this reaction. However, these metals having multiple oxidation states, particularly iron and copper, are known to be particularly problematic if in solution with for example hydrogen peroxide or persulfates. Further, cobalt, manganese, and cerium in solution have environmental concerns. All are a contaminant to the substrate. Finally, all, if in solution, are believed to act as promoters rather than activators. We have found, however, that if these elements or molecules are associated with a solid contacting the fluid, they can function as activators.

In one important embodiment, the activator comprises a metal-containing compound having the metal other than a metal of Group 4(b), Group 5(b) or Group 6(b) of the Periodic Table of Elements. In one embodiment, compounds of metals of Group 1(b) or Group 8 are preferred metal-containing activators.

In another important embodiment, the activator comprises any transition metal-containing compound that can react with a compound that produces free radicals, is associated with a solid. That is, the activators of the present invention are not soluble in the fluid. Activators can be associated with a particle. The particle may be an abrasive, or it may be a carrier for the activator.

Activators can be associated with a pad. Activators can be held in a matrix such that the fluid containing the compounds that form free radicals contacts the activator immediately before contacting the substrate.

Preferably, the activator can function effectively without actinic radiation, and the oxidizer itself can rejuvenate the activator. This step in some very preferred embodiments will also result in the formation of a second free radical, though often a weaker free radical than was produced in the first step. For example, without being bound to theory, as opposed to the classical Fenton's reaction which is the oxidation of Fe(II) by hydrogen peroxide, the reaction of the surface bound Fe activator of this system by hydrogen peroxide forms both superoxide anion and hydroxyl radicals. Therefore, hydrogen peroxide is both an oxidant and reductant in these systems.

If an activator is itself made effective with light, the "effectiveness" of the activator will decay when it is not exposed to light. It is very difficult to get light between a pad and a substrate, and therefore concentration gradients will occur.

Generally, the preferred activators are iron, copper, cerium, nickel, manganese, and/or cobalt. They can be used in any combination. The more preferred activators are iron or cerium salts.

It is advantageous that the activator be associated with a surface, as opposed to being for example a solid crystal. The activator can be a homogeneous composition of the active activator. The homogenous activator are preferably small particles with high surface areas. This form of activator should have a mean particle diameter less than about 1 micron, preferably less than 0.4 microns, more preferably less than 0.1 microns, and a surface area greater that about 10 $m^2$/g. The same preferred particle characteristics will also optimize the colloidal stability of the activator in the polishing compositions.

Solid crystals of activator-type material often do not have sufficient binding capacity/flexibility in the binding of the atoms to allow the activator components to change oxidation states to react with the compound that produces free radicals. Interaction of crystals may result in crystal dissolution, as the metal leaves the crystal and enters the solution. For this reason solid activator material is generally discouraged, though if metal loss is insignificant solid activator particles can be contemplated. The metal-containing activator compounds associated with a particle or a pad may be in a variety of forms, such as an oxide, a nitrate, a halide, a perchlorate, or an acetate of the metal. The counter-ions are generally of lesser significance, unless they stabilize the activator by hindering access to the compounds that form free radicals.

In one embodiment, the activator associated with a particle and/or polishing pad is a metal-containing acetate, such as copper acetate ("CuAc") or iron acetate ("FeAc") or cerium acetate ("CeAc").

The metal-containing activator compounds may be a source of ions associated with a solid and not dissolved in the fluid containing the oxidizer.

Activator oxides can often be used but are not preferred.

By way of example, suitable metal oxides include some iron oxides, copper oxide, and cobalt oxide. Some, for example cerium oxide and aluminum oxide may not be able to function as an activator, even if coated on an abrasive.

Further, the activators of the current invention are not for example titanium oxides which require actinic energy to be effective.

The activators of the present invention can include iron and copper oxides at very low amounts. Many forms of iron oxide are not activators but rather catalyze decomposition of preferred oxidizers such as hydrogen peroxide without forming the beneficial free radicals. While iron is a greatly preferred activator, there are conditions under which it will form an oxide/hydroxide that can catalytically cause decomposition of hydrogen peroxide and ammonium persulfate without forming free radicals, and resulting in dangerous conditions as oxygen levels increase. Certain crystals, for example certain forms of iron oxide and hydroxide, do not activate compounds that form free radicals, for example hydrogen peroxide.

However, several iron and copper oxides form superoxide anions and hydroxyl radicals, but may be rate limited by the oxidation of surface bound iron by hydrogen peroxide. Three iron oxides: ferrihydrite, goethite, and semi-crystalline iron oxide, are somewhat active in activating hydrogen peroxide, but activator disposed as a layer on a surface of a metal oxide particle has much superior kinetics.

The activator is preferably chemically or physically associated with the surface of a particle as molecular species, as a small particle or as a monolayer. For example, a doped Ceria-gamma Alumina Supported Nickel is a useful activator for some compounds that form free radicals. The activator activity of an alumina supported copper oxide, compared to that of goethite, has shown that the supported copper oxide was approximately ten times more active than goethite. For traditional Fenton's reactions, Fe containing zeolite when compared with the behavior of homogeneous Fe activators at the same experimental conditions found the heterogeneous activators have a higher reactivity and a reduced dependence on the pH of the solution. However, under some conditions they can also have a higher rate of the side reaction of hydrogen peroxide decomposition to water and oxygen.

The abrasive can be a co-formed abrasive in which the activator is homogeneously mixed with another oxide to form solid particles containing an intimate mixture of the activator supported on metal oxide. In addition the activator can be chemically or physically adsorbed on the surface of the abrasive as molecular species, small particles or as a monolayer.

In most embodiments of the present invention, however, the transition-metal-containing-activator is associated with an abrasive particle.

The amount of activator in a slurry can be low. Of course, activator associated with particles in a slurry can be present in any activating amount, say from about 0.0005 wt % to about 10 wt %.

High concentrations are usually wasteful, however. In a system with transition metal containing activator, i.e., a slurry having a transition metal activator coated on solid particles contained within the slurry, excellent free radical activity is observed if the amount of activator in the slurry is about 5 to 10000 ppm total activator.

If the activator is located on particles such that access to fluid is not impaired, a slurry can have between 5 and about 4000 ppm, for example between about 10 and 1000 ppm.

In preferred low-activator-content slurries tested, activator concentrations of between about 5 and about 200 ppm, for example between about 20 and about 100 ppm, say about 30 ppm, of activator expressed as a weight percent of the slurry, provided accelerated etch rates compared to formulations without activator.

Compounds or salts that might otherwise be considered an activator are not included if they do not function as an activator. As used herein, therefore, a transition metal is an activator only if it is associated with a solid. For example, activator within a particle matrix where it cannot generate free radicals that can escape the particle structure is not included in the term activator.

Activator elements or compounds that cannot activate the formation of free radicals, for example because it is incorporated within a matrix where changes between oxidation states is discouraged, is not included as activator. Compounds that can plate out or contaminate the substrate are viewed as contaminants.

Finally, activator that is chelated or otherwise not available for reaction with the compound that produces free radicals is not included as activator.

In one important embodiment of the present invention, at least a portion of the activator is associated with at least a portion of the abrasive particles. In its most general meaning, the term "associated" means that activator compounds are affixed to the surface of an abrasive particle, such that the activator contacts the fluid containing the Free Radical-Producing Compound, wherein the contacting results in significant increase in free radical formation (as determined by significant increase in CMP removal rates discussed previously). Generally, having the activator be associated with the abrasive means the activator is coated on the abrasive, absorbed onto the abrasive, or is adsorbed on to the abrasive, or is otherwise attached or bound to the abrasive. The activator coating can be in a pure form, or the activator can be admixed with other compounds, minerals, metals, and the like, to form an activator composition that is coated onto at least a portion of an abrasive.

In preferred embodiments very little, preferably none, of the activator breaks the association with the abrasive and enters the solution as an ion or soluble compound, or plates onto the substrate. Therefore, the abrasive with the associated activator may be stabilized. For example, the abrasive with the associated activator may be calcined. The abrasive with the associated activator may be subsequently covered with or treated with other compounds including stabilizers, surfactants, silanes, or other components. Or, the abrasive with the associated activator may be covered with or treated with other compounds and calcined.

A system with iron activator, i.e., a slurry having iron coated on solid particles contained within the slurry, shows excellent free radical activity if the amount of activator iron is about 2 to 500 ppm total activator iron, preferably 3 to 100 ppm total activator iron, and for low iron embodiments about 4 to 20 ppm total activator iron. Iron that is not contacting the fluid, including iron for example within a particle matrix where it cannot generate free radicals that can escape the particle structure, is not included in the term activator iron. Iron that cannot activate the formation of free radicals, for example because it is incorporated within a matrix where changes between oxidation states is discouraged, is not included in activator iron. Finally, iron that is chelated or otherwise not available for reaction with the compound that produces free radicals is not included as activator iron. An exemplary slurry has about 50 ppm to about 300 ppm total activator iron, most of it absorbed, adsorbed, or coated onto the abrasive.

In low-metal-containing-activator embodiments, less than 80 ppm total metal-containing activator in a slurry can be used. This activator may act alone, or be supplemented with for example activator on the pad and/or non-metal-containing activator in the fluid. In preferred low-metal-containing-activator embodiments, less than 40 ppm total metal-containing activator in a slurry can be used, for example between about 5 ppm and about 30 ppm, or about 5 ppm to 20 ppm. Of course, the limits on the metal content of the fluid contacting the substrate and having the compound producing the free radical and optionally other oxidizers is still important. It is highly beneficial, even when the slurry contains up to 500 ppm of activator associated with particles, to have for example less than 20 ppm, preferably less than 8 ppm, for example less than 4 ppm, of these metals in solution in the fluid contacting the substrate.

An activator associated with an abrasive means the activator is not in solution in the slurry. Metals in solution act as promoters and will therefore contaminate a substrate. Further, if chemical reactions occur to cause the activator to tend to plate out (i.e., be reduced to a metallic state), the activator will still not move from the surface of the abrasive, and therefore will not plate out on the substrate. Additionally, we have surprisingly found that activator associated with an abrasive has a much lower tendency to spontaneously decompose certain oxidants, for example hydrogen peroxide, even at higher pH values where hydrogen decomposition by metal ions in solution is known. While not being bound by theory, generally, an activator associated with an abrasive is believed to only incidentally contact the substrate.

Copper is a known Fenton's agent, and therefore copper associated with solids makes an excellent activator. As copper can shift from a cuprous and cupric oxidation states, there will always be two bonding sites whereby the copper may be associated with the active sites on the abrasive material. The copper can be associated with the abrasive in the form of a salt, for example a cupric salt, a cuprous salt, in some forms a copper oxide, and in some forms metallic metal. Generally, metallic metal will be transformed to the cupric or cuprous form in the presence of oxidizers.

Silver is a useful activator for many systems, and can be coated onto for example silica, ceria, alumina, and other known abrasives, but if silver changes oxidation states, it may under some conditions become un-associated from the solid material. Additionally, the cost of silver is prohibitive unless recovery/recycle systems are in place. Finally, silver ions can complicate disposal of used slurry.

While gold coated onto one or more abrasives may be a useful activator for many systems, unless there is rigorous recovery and recycling of the activator-coated particles, the material cost will be too great for most commercial operations. On the other hand, gold may facilitate the production of free radicals without itself changing oxidation states. The same can be said for platinum and palladium coated onto a solid. Coated or doped noble metals (Au, Ag, Re, Ru, Rh, Pd, Os, Ir, Pt) are as a rule present in elemental form or also have oxidic surface regions.

Iron associated with an abrasive is particularly useful and is the most preferred activator. Iron associated with silica is the most preferred system. The silica, with its numerous OH groups, can multiply bind with the iron, holding the iron firmly associated with the silica by a number of covalent and/or ionic type bonds. Yet, the plurality of bonds of iron onto the silica, be it absorbed, adsorbed, or coated, allows easy transformation between oxidation states without the iron having a tendency to dis-associate from the silica surface. Surprisingly, iron associated with silica can be used at high pH values, for example from pH 5 to pH 7 and in some cases up to pH 8. It is known that soluble iron at these pH values forms undesirable precipitates which contaminate substrate and which catalyze degradation of hydrogen peroxide into oxygen and water, resulting in unsafe explosive accumulations of gases.

The iron can be associated with the abrasive in the form of a salt, for example a ferric salt, a ferrous salt, in some forms a ferric oxide, and in some forms metallic metal. Generally, metallic metal will be transformed to the ferric or ferrous form in the presence of oxidizers. An additional advantage of iron is that it is environmentally benign and does not pose significant disposal problems.

Iron associated with alumina is also a useful abrasive/activator, as is iron associated with ceria. Iron associated with polymeric particles, or particles that have a polymeric component, are also useful.

Cerium salts, which can be absorbed, adsorbed, or coated onto a solid, are also very useful abrasive/activators. Like iron, these ions can be strongly held by the active sites on the abrasive and/or particle, and once absorbed, adsorbed or coated, do not tend to become un-associated with the particle. Cerium salts can be used beneficially with for example iodine.

In another embodiment, metal-containing activator compounds comprising cobalt, copper, iron, cerium, or mixtures thereof are suitable activators. Nickel, silver, or any combination thereof are suitable activators for some compounds which produce free radicals.

In another embodiment, metal-containing compounds having standard oxidization potential of from about −0.52 to about −0.25 eV are suitable activators.

Examples of metal activators with oxidation potentials in this range include copper (−0.52 eV), iron (−0.44 eV), cobalt (−0.28 eV), and nickel (−0.25 eV).

In another embodiment, formation of free radicals is promoted by an electric potential externally imposed across an activator/fluid system so the activator has an oxidation potential within this range.

Descriptions of redox systems involving activators that generate free radicals in the presence of oxidizing agents are provided in Walling, C., Free Radicals in Solution (1957), pp. 564-579, and Bacon, R, The Initiation of Polymerisation Processes by Redox Catalysts, Quart. Revs., Vol. IX (1955), pp. 287-310, the entire contents of which are incorporated herein by this reference. Such catalysts are candidate activators, and may be for example associated with the abrasive used in the composition.

Compounds that do not need actinic radiation, for example UV radiation, to be effective as an activator are preferred activators. It is known that titanium oxides, when activated with actinic radiation, may form free radicals under certain conditions. This is not useful under CMP polishing conditions.

However, where the production of free radicals might be promoted where the production is acceptable without actinic radiation can be included. For example, formation of free radicals may promoted by actinic radiation for certain iron-based or a copper-based activators.

A preferred Group 8 metal is iron. A preferred Group 1(b) metal is copper. Another preferred metal activator is cerium, a Group 3(b) activator. However, it is known that iron, copper, and cerium ions can cause metallic contamination of the substrate surface. Further, iron ions added as ferric nitrate to a hydrogen peroxide mixture was found to create undesirable degradation of the hydrogen peroxide and of the ferric ions. Other metallic ions have similar problems.

Surprisingly, the metal compounds, particularly the iron compounds, associated with an abrasive were found to have a large effect on the etching rate of a CMP slurry despite the fact that the iron ions largely did not contact the substrate, and did not cause direct oxidation of the substrate by taking electrons from the substrate, did not cause oxidation of the substrate by shuttling electrons from the oxidizer to the substrate. Rather, the iron compounds cause formation of free radicals, most preferably reactive oxygen radicals.

It is believed that the composition of one important embodiment of the present invention is particularly advantageous by virtue of the interaction between at least one activator that is associated with a surface of a solid and at least free radical-forming compound, i.e., oxidizing agent, that is in the fluid. That is, it is believed that a reaction takes place between the activator that is for example coated on an abrasive, and the oxidizing agent that is in the fluid, such as a peroxide or hydroperoxide, at the solid activator/liquid interface. It is believed that this reaction generates free radicals or active reaction intermediates, such as hydroxyl free radicals, at the activator surface, which favorably interact with the targeted material on the substrate when the free radicals contact the targeted substrate, which may be facilitated when the activator coating on the abrasive contacts the substrate surface.

The activator may include a metal-glycine complex, wherein the metal consists essentially of cerium, iron, manganese, cobalt, or mixture thereof.

Mixtures of activators can give increased activity. Cerium salts are particularly useful when admixed with iron or copper. Manganese salts are particularly useful when admixed with iron or copper.

Rare earth metals may be useful when admixed with iron or copper. U.S. Pat. No. 5,097,071, the disclosure of which is incorporated herein by reference, teaches preparation process for an alumina supported copper useful for initiating Fenton's reaction, where the copper is impregnated with compounds of manganese and of one or more rare earth metals, having a Cu content of 0.1-5% by weight, a total content of compounds of manganese and of the rare earth metal or metals of 0.05 to 8% by weight, calculated as metals.

The following may be mentioned as rare earth metals (subgroup III of the periodic table of elements): scandium, yttrium, lanthanum and the lanthanies. Yttrium, lanthanum, cerium, praseodymium, neodymium and dysprosium are preferred, cerium and lanthanum are particularly preferred and cerium is very particularly preferred. In some embodiments, compounds of Ag, Cr, Mo, Mn, Nb, Nd, Os, Pd, Pt, Rh, Ru, Sc, Sm, Ta, Ti, V, or W which are associated with the surface of a particle which contains activator are useful. They may facilitate the action of the activators or with some compounds that form free radicals they may themselves become activators.

In some embodiments, for example when the abrasives or other particles having the activator associated with the surface are to be stored or handled, or when the activator makes a portion of the slurry unstable, the surface of the activator can be passivated. Passivating agents are beneficially relatively insoluble with respect to the bound activator (will not cause the activator to leave the particle) and also to have an affinity for the activator-coated particle. At selected pH values, selected carboxylic acid salts, for example oxalate, gallate, citrate, and the like can be made to coat the activator-containing particles. These passivators often can eliminate free radicals, which further enhances stability. Other passivators include succinates, benzoates, formates, cupferons, and 8-hydroxyquinoline. However, it is generally advisable to have the pH and or ionic conditions change prior to polishing so that the activator can be exposed and function.

Particles having the activator can be treated with various agents to enhance colloidal stability, including carboxylic acids and polycarboxylic acids.

Soluble iron catalysts can also be used with the additives described herein as part of the invention. Suitable soluble iron catalysts for the pH range of this invention but not limited to are ammonium iron (III) oxalate trihydrate, iron (III) citrate tribasic monohydrate, iron(III) acetylacetonate and ethylenediamine tetraacetic acid, iron (III) sodium salt hydrate. A soluble catalyst can also be a metal compound of Ag, Co, Cr, Cu, Fe, Mo, Mn, Nb, Ni, Os, Pd, Ru, Sn, Ti, V and mixtures thereof having multiple oxidation states.

In most embodiments of the present invention, the activator includes, but is not inorganic oxide particle with transition metal coated onto its surface and soluble catalyst.

Transition metals include, but are not limited to, copper, manganese, cobalt, and cerium, as well as the more traditional iron and copper, and other transition metals, after these transition metals are coated onto the inorganic oxide particle surfaces, they become immobilized heterogeneous catalysts which are able to catalyze the chemical reactions involved in W CMP processes.

Soluble catalyst includes, but is not limited to ammonium iron (III) oxalate trihydrate, iron (III) citrate tribasic monohydrate, iron (III) acetylacetonate and ethylenediamine tetraacetic acid, iron (III) sodium salt hydrate, a metal compound having multiple oxidation states selected from the group consisting of Ag, Co, Cr, Cu, Fe, Mo, Mn, Nb, Ni, Os, Pd, Ru, Sn, Ti, V; and combinations thereof.

The amount of activator in a slurry ranges from about 0.0005 wt % to about 10 wt %; preferably 0.001 wt % to 2 wt %, more preferably between 0.01 wt % to 1 wt %; most preferably between 0.05 wt % to 0.5 wt %.

pH Adjustors

The pH of the composition is desirably on the order of from about 1 to about 12, preferably from about 2 to about 10, more preferably from about 3 to about 9, and most preferably from about 6 to about 8.

The pH of the composition may be adjusted using an appropriate pH adjusting agent, such as a suitable acid, base, amine, or any combination thereof. Preferably, a pH adjusting agent used in the composition does not contain metal ions, such that undesirable metal components are not introduced into the composition. Suitable pH adjusting agents include amines, ammonium hydroxide, potassium hydroxide, nitric acid, phosphoric acid, sulfuric acid, organic acids, and/or salts thereof, and any combination thereof.

In certain embodiments, the CMP composition further comprises a biocide. The use of biocide in the enclosed CMP polishing compositions reduces or eliminates bacteria and other microorganisms, especially when the pH values of the CMP polishing compositions is close or around neutral pH conditions.

The biocide ranges from about 0.0001 weight % to about 0.03 weight %.

Promoters

As stated above, although metals having multiple oxidation states that are dissolved in the fluid contacting the substrate can act as oxidizers, the most preferred embodiments of this invention have substantially no metals having multiple oxidation states.

In some embodiments, compounds of Al, Ag, Ce, Co, Cr, Cu, Fe, Mo, Mn, Nb, Nd, Ni, Os, Pd, Pt, Rh, Ru, Sc, Sm, Ta, Ti, V, or W in minor amounts dissolved in the solution are useful. These are believed to facilitate the action of the oxidizers, as discussed in U.S. Pat. No. 5,958,288, the disclosure of which is incorporated herein by reference. Metal ions in solution are believed to act as oxidizers with a degree of affinity to the substrate, particularly to metal substrates. If they are able to be oxidized by other oxidizers in the fluid, there will be some synergistic action between the two. In most cases the promoters are believed not to facilitate the action of the free radicals, however. Compounds that form promoters on exposure to a catalyst or substrate, such as those compounds described in U.S. Pat. No. 5,863,838, the disclosure of which is incorporated by reference, are also useful.

In some embodiments of the present invention, the fluid composition contacting the substrate has a small amount of metal ion oxidizers, herein called promoters. Soluble compounds or salts of copper, aluminum, cerium, and iron are used as oxidizers or promoters in CMP solutions. If used, a preferred metal-containing oxidizer promoter is soluble cerium salts or aluminum salts.

The amount of promoter in a slurry ranges from about 0.0001 wt % to about 1.0 wt %; preferably 0.0005 wt % to 0.5 wt %, more preferably between 0.0025 wt % to 0.1 wt %.

Chelators

If no-(dissolved)-metal-containing embodiments are desired, the fluid may have chelators. Chelators can essentially trap and isolate metals having multiple oxidation states that are present in dissolved form in the fluid. If dissolved metals are in chelated form, this essentially isolates them from the substrate, which impairs their efficiency as a promoter but prevents metal ion contamination. This can extend the potlife of a slurry of oxidizer, however, and at low concentrations the chelators will not effectively impair the efficiency of the free radicals.

Therefore, only small amounts of chelator should be used. Chelators generally contain organic acid moieties, which can act as free radical quenchers. This could adversely affect the system performance.

In most embodiments of the present invention, the chelator includes, but is not limited to organic carboxylic acids, organic sulfonic acids, and organic phosphoric acids.

Generally, less than 3%, preferably less than 1%, for example less than 0.5% by weight of chelators are preferred.

Stabilizers

The composition may also include one or more of various optional additives. Suitable optional additives include stabilization agents. These optional additives are generally employed to facilitate or promote stabilization of the composition against settling, flocculation (including precipitation, aggregation or agglomeration of particles, and the like), and decomposition. Stabilizers can be used to extend the pot-life of the oxidizing agent(s), including compounds that produce free radicals, by isolating the activator material, by quenching free radicals, or by otherwise stabilizing the compounds that form free radicals.

Some materials are useful to stabilize hydrogen peroxide. One exception to the metal contamination is the presence of selected stabilizing metals such as tin. In some embodiments of this invention, tin can be present in small quantities, typically less than about 25 ppm, for example between about 3 and about 20 ppm. Similarly, zinc is often used as a stabilizer. In some embodiments of this invention, zinc can be present in small quantities, typically less than about 20 ppm, for example between about 1 and about 20 ppm. In another preferred embodiment the fluid composition contacting the substrate has less than 500 ppm, for example less than 100 ppm, of dissolved metals, except for tin and zinc, having multiple oxidation states. In the most preferred commercial embodiments of this invention, the fluid composition contacting the substrate has less than 9 ppm of dissolved metals having multiple oxidation states, for example less than 2 ppm of dissolved metals having multiple oxidation states, except for tin and zinc. In some preferred embodiments of this invention, the fluid composition contacting the substrate has less than 50 ppm, preferably less than 20 ppm, and more preferably less than 10 ppm of dissolved total metals, except for tin and zinc.

As metals in solution are generally discouraged, it is preferred that those non-metal-containing oxidizers that are typically present in salt forms, for example persulfates, are in the acid form and/or in the ammonium salt form, such as ammonium persulfate.

Other stabilizers include free radical quenchers. As discussed, these will impair the utility of the free radicals produced. Therefore, it is preferred that if present they are present in small quantities. Most antioxidants, i.e., vitamin B, vitamin C, citric acid, and the like, are free radical quenchers. Most organic acids are free radical quenchers, but three that are effective and have other beneficial stabilizing properties are phosphonic acid, the binding agent oxalic acid, and the non-radical-scavenging sequestering agent gallic acid.

In addition, it is believed that carbonate and phosphate will bind onto the activator and hinder access of the fluid. Carbonate is particularly useful as it can be used to stabilize a slurry, but a small amount of acid can quickly remove the stabilizing ions. Stabilization agents useful for absorbed activator can be film forming agents forming films on the silica particle.

Suitable stabilizing agents include organic acids, such as adipic acid, phthalic acid, citric acid, malonic acid, orthophthalic acid; and, phosphoric acid; substituted or unsubstituted phosphonic acids, i.e., phosphonate compounds; nitriles; and other ligands, such as those that bind the activator material and thus reduce reactions that degrade the oxidizing agent, and any combination of the foregoing agents. As used herein, an acid stabilizing agent refers to both the acid stabilizer and its conjugate base. That is, the various acid stabilizing agents may also be used in their conjugate form. By way of example, herein, an adipic acid stabilizing agent encompasses adipic acid and/or its conjugate base, a carboxylic acid stabilizing agent encompasses carboxylic acid and/or its conjugate base, carboxylate, and so on for the above mentioned acid stabilizing agents. A suitable stabilizer, used alone or in combination with one or more other stabilizers, decreases the rate at which an oxidizing agent such as hydrogen peroxide decomposes when admixed into the CMP slurry.

On the other hand, the presence of a stabilization agent in the composition may compromise the efficacy of the activator. The amount should be adjusted to match the required stability with the lowest adverse effect on the effectiveness of the CMP system. In general, any of these optional additives should be present in an amount sufficient to substantially stabilize the composition. The necessary amount varies depending on the particular additive selected and the particular make up of the CMP composition, such as the nature of the surface of the abrasive component. If too little of the additive is used, the additive will have little or no effect on the stability of the composition. On the other hand, if too much of the additive is used, the additive may contribute to the formation of undesirable foam and/or flocculant in the composition. Generally, suitable amounts of these optional additives range from about 0.001 to about 2 weight percent relative to the composition, and preferably from about 0.001 to about 1 weight percent. These optional additives may be added directly to the composition or applied to the surface of the abrasive component of the composition.

Surfactants

If a surfactant is added to the CMP slurry, then it may be an anionic, cationic, nonionic, zwitterionic surfactant or amphoteric surfactant or a combination of two or more surfactants can be employed.

Various anionic and cationic surfactants having molecular weight in the range from less than 1000 to greater than 30,000 are contemplated as dispersants. Included are lauryl sulfate, alkyl polyphosphate, dodecyl benzene sulfonate, disopropylnaphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate. Alternate dispersants contemplated in the present invention include: polyethylene glycols, lecithin, polyvinyl pyrrolidone, polyoxyethylene, isoctylphenyl ether, polyoxyethylene nonylphenyl ether, amine salts of alkylaryl sulfonates, polyacrylate and related salts, polymethacrylate.

In general, a surfactant that may be used in the CMP slurry should be sufficient to achieve effective stabilization of the slurry and will typically vary depending on the particular surfactant selected and the nature of the surface of the metal oxide abrasive. For example, if not enough of a selected surfactant is used, it will have little or no effect on CMP slurry stabilization. On the other hand, too much surfactant in the CMP slurry may result in undesirable foaming and/or flocculation in the slurry.

It also has been found that the addition of a surfactant may be useful to reduce the within-wafer-non-uniformity (WIWNU) of the wafers, thereby improving the surface of the wafer and reducing wafer defects.

While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF 16™ manufactured by Union Carbide and SUIRFYNOL™ manufactured by Air Products and Chemicals.

The surfactant generally is present in the slurry of this invention in an amount ranging from about 0.001% to about 0.2% by weight, and preferably from about 0.001 to about 0.1 weight percent.

Furthermore, the additive may be added directly to the slurry or treated onto the surface of the metal oxide abrasive utilizing known techniques. In either case, the amount of additive is adjusted to achieve the desired concentration in the polishing slurry.

Corrosion Inhibitors

The corrosion inhibitor includes any corrosion inhibitor that reduces static etching rates on W film surfaces and provide W film surface corrosion inhibition.

In most embodiments of the present invention, the corrosion inhibitor includes, but is not limited to various molecular weights of PEG and PEO, benzotriazole and its derivatives, 1,2,4-triazole and its derivatives, 1,2,3-triazole and its derivatives, imidazole and its derivatives, pyrazole and its derivatives, benzimidazole and its derivatives, and combinations thereof.

Generally, the corrosion inhibitor ranges less than 1.0 wt %, preferably less than 0.5 wt %.

While we these formulations greatly reduce need for use of any corrosion inhibitors, certain highly challenging applications may require use of corrosion inhibitor. Corrosion inhibitor can be a film forming agent or it can act by any other mechanisms such as cathodic inhibition, controlling reactions associated with hydroxyl radicals, etc.

WORKING EXAMPLES

General Experimental Procedure

Parameters:
Å: angstrom(s)—a unit of length
BP: back pressure, in psi units
CMP: chemical mechanical planarization=chemical mechanical polishing
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
TEOS silicon oxide films by Chemical Vapor Deposition (CVD) using tetraethylk rthosilicate as the precursor
Removal Rate (RR)=(film thickness before polishing–film thickness after polishing)/polish time.

All concentrations of components are wt % unless otherwise indicated.

In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. Polishing Pad IC1010 pad, supplied by Dow Corporation was used for CMP process.

200 mm diameter silicon wafers coated with tungsten films or tungsten containing patterned structures were used. Tungsten removal rates were measured using sheet resistance measurement techniques and patterned wafers were analyzed with a KLA Tencor P15 Profiler (large feature sizes) or an AFM tool (small feature sizes).

Example 1

All slurry examples were based on a base slurry or formulation. The components of the base slurry was listed in Table 1.

JGC 160 Colloidal Silica having mean particle size 160 nm was purchased from JGC Catalysts and Chemicals Ltd.

Fe coated Catalyst can be made for example, by the methods described in the published U.S. Pat. Nos. 7,029,508; 7,014,669; 7,427,305; and 7,429,338; the contents of which are hereby incorporated by reference as if set forth in their entireties. Biocide (Neolone M-10) was supplied by Dow Chemical Company.

The base slurry was diluted to obtain working slurries by adding 9 parts by weight of water to 1 part by weight of base slurry concentrate listed in table 1. Hydrogen peroxide was the added to the diluted slurry to yield a concentration of 3 wt % to obtain the control slurry.

TABLE 1

| Base Slurry | |
| --- | --- |
| Component | wt % |
| Fe coated Catalyst | 1.7 |
| Colloidal Silica (160 nm) | 5 |
| Biocide (Neolone M-10) | 0.015 |
| Potassium hydroxide | 0.11 |
| Water | 93.285 |

Specific additive was added to the control slurry (total weight was 100%) to obtain the slurry concentrate.

TABLE 2

| Cationic Additives |
| --- |
| Poly(dimethylamine-co-epichloro-hydrin-co-ethylenediamine) solution |
| Poly(diallyldimethylammonium chloride |
| Hexadecyltrimethylammonium p-toluenesulfonate |
| Poly(methacryloyloxyethyltrimethylammonium) chloride |
| Poly[bis(2-chloroethyl) ether-alt-1,3-bis[3-(dimethylamino)propyl]urea] quaternized |
| Polyacrylamide |
| Poly(acrylamide-co-diallyldimethylammonium chloride solution |
| Poly[(2-ethyldimethylammonioethyl methacrylate ethyl sulfate)-co-(1-vinylpyrrolidone)] |
| Poly(1-vinylpyrrolidone-co-2-dimethylaminoethyl methacrylate) |
| Polyethylenimine |
| Polyethylenimine, 80% ethoxylated |

99 pH of the slurries was adjusted with potassium hydroxide. pH was around 7.

A list of cationic polymers (shown in table 2), which had been used in the above mentioned prior publications, were used and tested in CMP slurries. However, these additives caused colloidal instability; the additives led to silica particle flocculation in CMP slurries with neutral pH, such as a pH of 7.

N-Oleoyl sarcosinate, N-Lauroyl sarcosinate, and polyethylene oxide (PEO) with a molecular weight of 100,000 had been used and tested on large bond pad features (100× 300 μm).

The polishing was performed at 3.5 psi down force, 127 RMP table speed and 90 ml/min slurry flow rate.

TABLE 3

| Oleoyl Sarcosinate, PEO dishing | |
| --- | --- |
| Additive | 100 × 300 μm Dishing [Å] |
| Control | 2166 |
| 50 ppm N-Oleoyl Sarcosinate | 1587 |
| 50 ppm N-Lauroylsarcosinate | 1222 |
| 500 ppm PEO (MW = 100k) | 823 |

As shown in table 3, Oleoyl sarcosinate reduced the dishing versus the control without an additives by >26%; N-Lauroyl sarcosinate by >43%; and PEO by >62%. The dishing was significantly reduced.

TABLE 4

Dishing on small lines

| Additive | 0.5 μm line [Å] |
|---|---|
| Control | 266 |
| Oleoyl Sarcosinate (100 ppm) | 188 |
| N-Lauroylsarcosinate(100 ppm) | 134 |
| PEO (MW = 100k) (100 ppm) | 51 |

Some of these additives were also tested on small line features with 0.5 μm size. The result (data) for the small line features was summarized in table 4. Sarcosinates provided >29% dishing reduction compared to the control. N-Lauroyl sarcosinate provided >49% dishing reduction, and PEO showed a dishing reduction of >80%.

Figure 1:
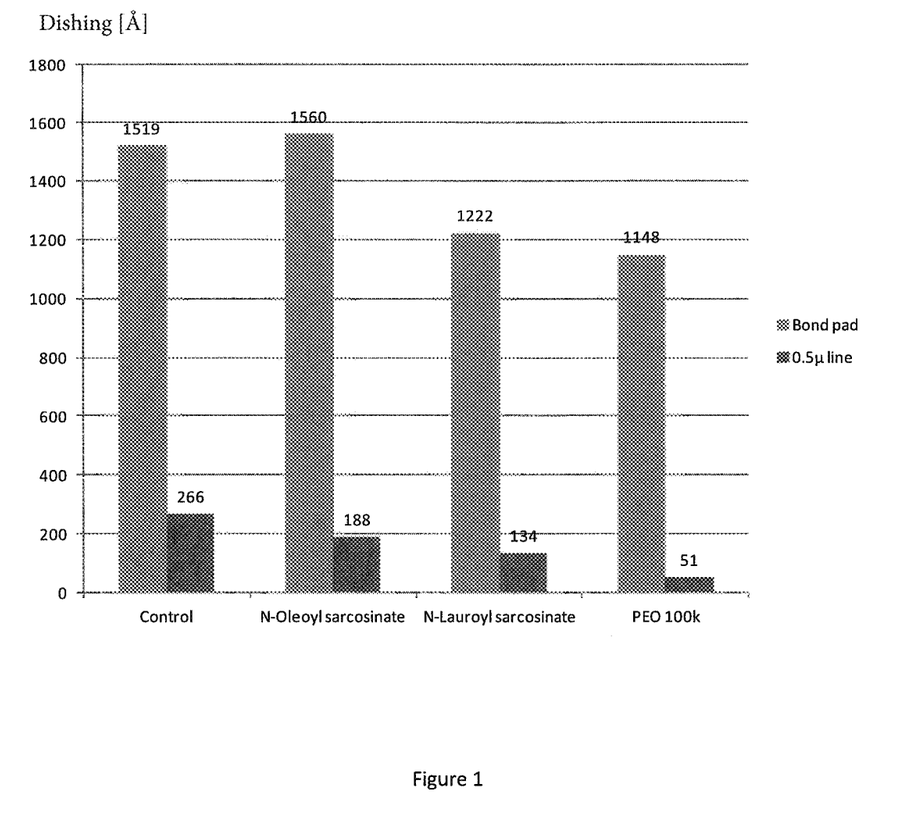
FIG. 1 shows dishing reducing results from slurries without (the control) and with additives (sarcosinates and polyethylene oxide (PEO with MW=100,000 g/mol)) on large and small feature sizes (large bond pad and small 0.5μ line).

The results for both large bond pad and small line features were shown in FIG. 1.

In order to further explore the concentration dependency of the additives on dishing concentration skew with Oleoyl sarcosinate and PEO (MW=100,000) were carried out. The data is shown in table 5 and FIG. 2.

Figure 2:
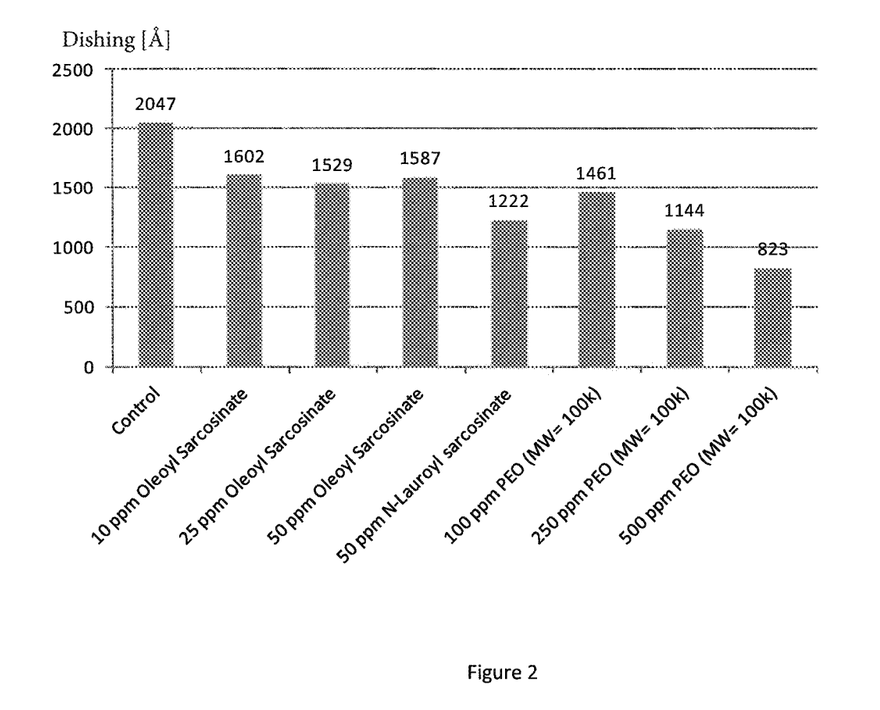
FIG. 2 shows dishing reducing results from slurries having different concentrations of additives (sarcosinates and polyethylene oxide (PEO with MW=100,000 g/mol)) on large feature size.

The result indicated that with increasing Oleoyl sarcosinate concentration from 10 to 50 ppm no further gain in dishing reduction was achieving.

Upon increasing the PEO (MW=100,000) concentration from 100 ppm to 500 ppm, the dishing was substantially reduced and was almost cut in half.

TABLE 5

Oleoyl Sarcosinate and PEO concentration skew

| Additive | 100 × 300 bond pad dishing [Å] |
|---|---|
| Control | 2047 |
| 10 ppm Oleoyl Sarcosinate | 1602 |
| 25 ppm Oleoyl Sarcosinate | 1529 |
| 50 ppm Oleoyl Sarcosinate | 1587 |
| 50 ppm N-Lauroyl sarcosinate | 1222 |
| 100 ppm PEO (MW = 100k) | 1461 |
| 250 ppm PEO (MW = 100k) | 1144 |
| 500 ppm PEO (MW = 100k) | 823 |

In comparison to Oleoyl sarcosinate, N-Lauroyl sarcosinate at the same concentration shows slightly lower dishing on both large and small features, as shown in Table 4 and 5.

Interestingly, a reversed trend was observed for lower molecular weight PEO (MW=200 to 20000) in that the dishing on large bond pads slightly increased with increased concentration as shown in table 6.

The mechanism for this opposing behavior of different molecular weight PEO is not clear yet.

TABLE 6

Dishing with different MW PEO:

| Additive | 100 × 300 μm bond pad dishing |
|---|---|
| Control | 1848 |
| 250 ppm PEO MW = 200 | 1444 |
| 500 ppm PEO MW = 200 | 1635 |
| 100 ppm PEO MW = 14000 | 1347 |
| 250 ppm PEO MW = 14000 | 1685 |
| 100 ppm PEO MW = 20000 | 1342 |
| 250 ppm PEO MW = 20000 | 1715 |

Alternatively to the sarcosinates, other salts of fatty acids as additives were also tested. The result from sodium stearate was shown in table 7. Sodium stearate showed a dishing reduction on large bond pads of about 10%.

TABLE 7

Sodium Stearate

| Additive | 100 × 300 μm bond pad dishing |
|---|---|
| Control | 1916 |
| 100 ppm Sodium stearate | 1738 |
| 250 ppm Sodium stearate | 1719 |

Copolymer and ethoxylated surfactants that contain hydrophobic part as for example a hydrocarbon or polypropylene oxide chain as well as hydrophilic part which is the polyethylene oxide chain, were also tested.

TABLE 8

Dishing of ethoxylated surfactants

| Additive | 100 × 300 μm bond pad dishing |
|---|---|
| Control | 1838 |
| 50 ppm Brij™ S10 | 1394 |
| 250 ppm Brij™ S10 | 1965 |
| 100 ppm Brij™ S100 | 1679 |
| 200 ppm PEG-PPG-PEG M = 1100 | 1535 |

Figure 3:
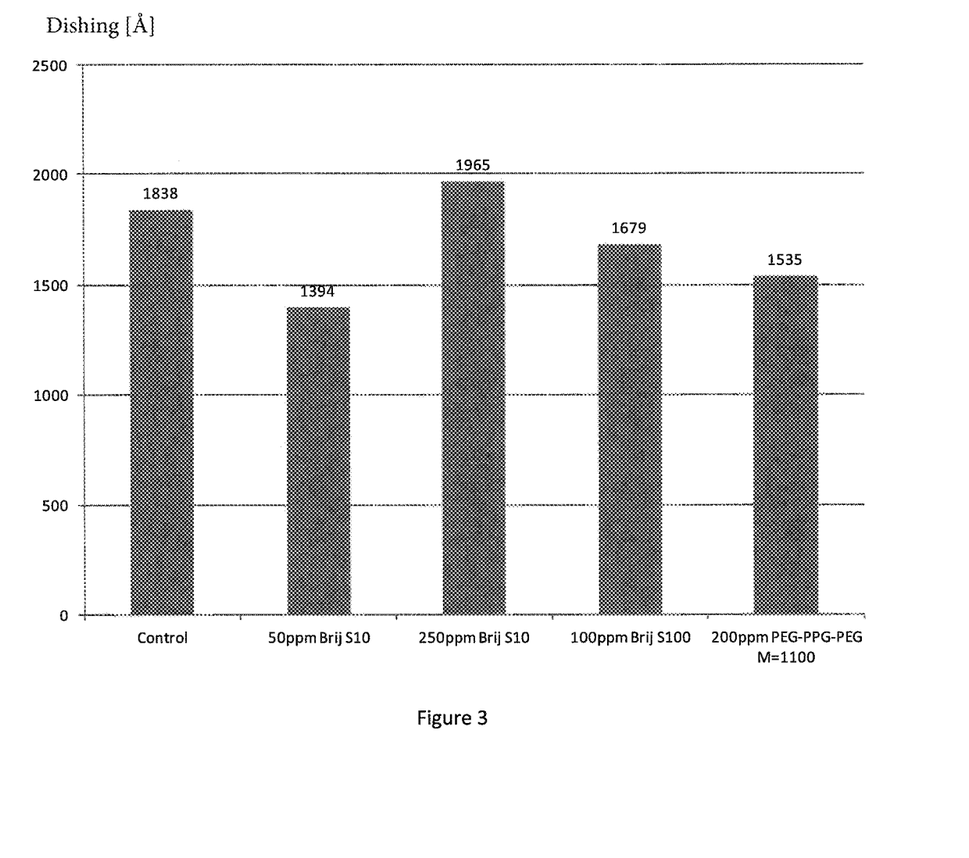
FIG. 3 shows dishing reducing results from slurries without (the control) and with additives (ethoxylated surfactants) on large feature size.

Ethoxylated fatty alcohols Brij™ S10, Brij™ S100; and copolymer PEG-PPG-PEG (Number average molecular weight=1100) were tested. Brij™ is a trade name of Croda International PLC. Brij™ S10 is for Steareth-10, and Brij™ S100 is for Steareth-100. All samples were purchased from Sigma-Aldrich Inc. The result was shown in table 8 and FIG. 3. Low concentration (50 ppm) of Brij™ S10 gave a better reduction of dishing on large bond pad features (100×300 μm) of 24%.

The tungsten removal rates ($W_{RR}$) from slurries were comparable to the removal rate from control slurry (>4500 Å/min.). Thus, there was no removal rate retarding by adding the additives to the control slurry. TEOS removal rates ($TEOS_{RR}$) also remained very low (<80 Å/min.). The working slurries provided excellent selectivity's of polishing, the ratio of the two, $W_{RR}/TEOS_{RR}$ was >60.

TABLE 9

Tungsten and TEOS blanket removal rate

| Additive | W RR [Å/min] | TEOS RR [Å/min] | Selectivity |
|---|---|---|---|
| Control | 5096 | 35 | 146 |
| 100 ppm N-Oleoyl Sarcosinate | 4751 | 32 | 148 |

TABLE 9-continued

Tungsten and TEOS blanket removal rate

| Additive | W RR [Å/min] | TEOS RR [Å/min] | Selectivity |
|---|---|---|---|
| 100 ppm N-Lauroyl Sarcosinate | 5096 | 76 | 67 |
| 100 ppm PEO 100k | 4884 | 57 | 86 |

Figure 4:
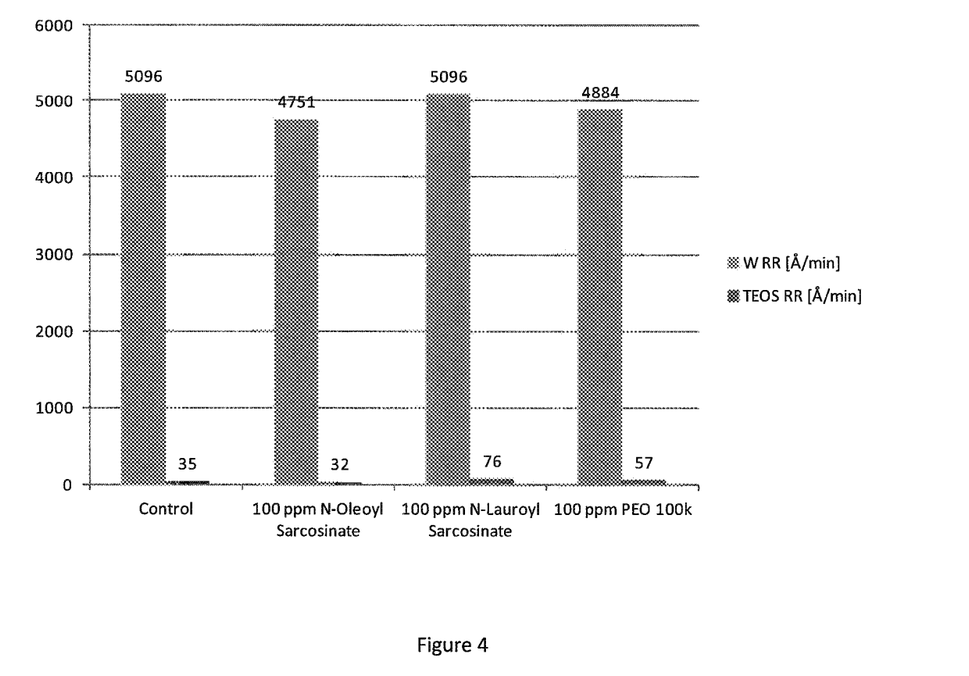
FIG. 4 shows the polishing results (Removal rates for W and TEO) from slurries without (the control) and with additives (sarcosinates and polyethylene oxide (PEO with MW=100,000 g/mol)).

The additives showed excellent performance in reducing the dishing, while, maintaining high tungsten blanket removal rates as well as high selectivity over silicon oxide (TEOS) removal as shown below in table 9 and FIG. 4.

Example 2

Control slurries or formulations were made comprising 0.17% iron coated silica particle catalyst, 0.6 wt % silica particles with different additives to suppress tungsten dishing. Hydrogen peroxide was added to the formulations before polishing to yield a concentration of 3 wt %. pH of the formulations after addition of hydrogen peroxide was between 6 and 7.

PEO (MW 100000, 150 ppm) and Pluronic™10R5 which is PPG-PEG-PPG block copolymer with number average molecular weight approximately 2000 were added to the control in this example.

Blanket tungsten, TEOS and patterned tungsten wafer (MIT 854mask, 5000 Å deposited tungsten thickness, 3000 Å trench depth with TEOS dielectric and Ti/TiN barrier layer) were polished using the formulations.

Polishing conditions were 2 psi membrane pressure, 113 RPM table speed, 111 RPM head speed, 90 RPM table speed, IC1010 polishing pad from Dow Chemicals. Patterned wafers were polished for 25% over polish past endpoint as measured by optical end-point technique.

Table 10 summarizes the removal rates and topography data for these formulations.

TABLE 10

|  | W RR (Å/min) | TEOS RR (Å/min) | 0.5/0.5 μm Line Dishing (Å) | 0.5/0.5 μm Line Array Erosion (Å) | 50/50 μm Line Array Dishing (Å) |
|---|---|---|---|---|---|
| No Additive | 3810 | 33 | 344 | 110 | 2932 |
| PEO (MW 100000, 150 ppm) | 2819 | 22 | 153 | 71 | 1776 |
| Pluronic 10 R5 (150 ppm) | 2744 | 15 | 141 | 23 | 1866 |

The results showed that the great reduction was achieved with the polymer additives in dishing for both small and large line-width structures, and in the erosion of line arrays.

Example 3

Control slurries or formulations were made comprising 0.005% ammonium iron (III) oxalate water soluble catalyst, 0.5 wt % silica particles with different additives to suppress tungsten dishing. pH of the formulation was adjusted to 5. Hydrogen peroxide was added to the formulations before polishing to yield a concentration of 3 wt %.

PEO (MW 100000, 150 ppm) and Pluronic™10R5 which is PPG-PEG-PPG block copolymer with number average molecular weight approximately 2000 were added to the control in this example.

Blanket tungsten, TEOS and patterned tungsten wafer (MIT 854mask, 5000 Å deposited tungsten thickness, 3000 Å trench depth with TEOS dielectric and Ti/TiN barrier layer) were polished using the formulations.

Polishing conditions were 2 psi membrane pressure, 113 RPM table speed, 111 RPM head speed, 90 RPM table speed, IC1010 polishing pad from Dow Chemicals. Patterned wafers were polished for 25% over polish past endpoint as measured by optical end-point technique.

Table 11 summarizes the removal rates and topography data for these formulations.

TABLE 11

|  | W RR (Å/min) | TEOS RR (Å/min) | 0.5/0.5 μm Line Dishing (Å) | 0.5/0.5 μm Line Array Erosion (Å) | 50/50 μm Line Dishing (Å) |
|---|---|---|---|---|---|
| No Additive |  |  | 164 | 110 | 1780 |
| PEO (MW 100000, 150 ppm) |  |  | 82 | 71 | 1310 |
| Pluronic 10 R5 (150 ppm) |  |  | 80 | 23 | 1443 |

Example 4

Control slurries or formulations were made comprising 0.005% ammonium iron (III) oxalate water soluble catalyst, 0.5 wt % silica particles.

Varying levels of Dabco 5604 surfactant was added to the control to suppress tungsten dishing. pH of the formulation was adjusted to 5. Hydrogen peroxide was added to the formulations before polishing to yield a concentration of 3 wt %. Method described in example 6 was used for polishing blanket and patterned tungsten wafers. Patterned W RR was calculated by dividing initial tungsten thickness on patterned wafer by the time required to each the end-point.

Polishing conditions were 2 psi membrane pressure, 113 RPM table speed, 111 RPM head speed, 90 RPM table speed, IC1010 polishing pad from Dow Chemicals. Patterned wafers were polished for 25% over polish past endpoint as measured by optical end-point technique.

Table 12 summarizes the data.

TABLE 12

|  | Blanket W RR (Å/min) | Patterned W RR (Å/min) | 0.5/0.5 μm Line Dishing (Å) | 0.5/0.5 μm Line Array Erosion (Å) | 50/50 μm Line Dishing (Å) |
|---|---|---|---|---|---|
| No Additive | 3320 | 4167 | 229 | 59 | 1424 |
| Dabco 5604 (150 ppm) | 2240 | 3191 | 124 | 122 | 1052 |
| Dabco 5604 (100 ppm) | 2462 | 3704 | 147 | 18 | 1023 |
| Dabco 5604 (50 ppm) | 2569 | 4286 | 120 | 49 | 1112 |

It is evident from Table 12 that while Dabco 5604 reduces the blanket tungsten rate, removal rate of patterned wafer is not affected. As a result, it is possible to reduce dishing without undesirable impact on the throughput of the polishing operation.

The additives disclosed in this invention showed excellent performance in reducing the dishing, while, they maintained high tungsten blanket removal rates as well as high selectivity over silicon oxide (TEOS) removal.

While the principles of the invention have been described above in connection with preferred embodiments, it is to be clearly understood that this description is made only by way of example and not as a limitation of the scope of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

The invention claimed is:

1. A polishing composition consisting of:
0.01 wt % to 30 wt % of abrasive;
0.01 wt % to 30 wt % of at least one oxidizing agent;
0.0005 wt % to about 10 wt % of activator;
0.1 ppm to 10,000 ppm of additive;
pH adjusting agent; and water;
optionally
at least one selected from the group consisting of biocide; surfactant; dispersion agent; chelator; film-forming anticorrosion agent; a polish enhancement agent; and combinations thereof;
wherein
the abrasive is selected from the group consisting of colloidal silica, fumed silica, alumina, titania, ceria, zirconia, surface modified particles selected from the group consisting of activator-containing particles and composite particles, lattice doped inorganic oxide particles; and combinations thereof;
the oxidizing agent is selected from the group consisting of peroxy compound selected from the group consisting of hydrogen peroxide, urea peroxide, peroxyformic acid, peracetic acid, propaneperoxoic acid, substituted or unsubstituted butaneperoxoic acid, hydroperoxyacetaldehyde, potassium periodate, ammonium peroxymonosulfate; and non-per-oxy compound selected from the group consisting of ferric nitrite, $KClO_4$, $KBrO_4$, $KMnO_4$; and combinations thereof;
the activator is selected from the group consisting of ammonium iron (III) oxalate trihydrate; iron (III) citrate tribasic monohydrate; iron (III) acetylacetonate; ethylenediamine tetraacetic acid, iron (III) sodium salt hydrate; and combinations thereof;
the additive is selected from the group consisting of organic polymer and copolymer having molecules containing ethylene oxide unit;
wherein the organic polymer has general molecular structure of wherein n refers to the total numbers of the repeating unit ranging from 4 to 113636;
the pH adjusting agent is selected from the group consisting of amine, ammonium hydroxide, potassium hydroxide, nitric acid, sulfuric acid, organic acid, and/or salt thereof, and combinations thereof; and
pH of the composition is between 2 and 10.

2. The polishing composition of claim 1, wherein the additive is polyoxyethylene (POE), polyethylene oxide (PEO), or polyethylene glycol (PEG) having molecular weights (grams/mole) ranging from 10000 to 400000.

3. The polishing composition of claim 1, wherein the additive is propylene glycol (PPG)-ethylene glycol (PEG) block copolymer, wherein PEG and PPG blocks can be arranged in different orders; PEG/PPG molar ratios ranges from 1:99 to 99:1; and molecular weight of the block copolymer ranges from 500 to 50000.

4. The polishing composition of claim 1 comprises colloidal silica; ammonium iron (III) oxalate trihydrate; hydrogen peroxide; the additive is selected from the group consisting of propylene glycol (PPG)-ethylene glycol (PEG) block copolymer, polyoxyethylene (POE), polyethylene oxide (PEO), polyethylene glycol (PEG) having molecular weights (grams/mole) ranging from 10000 to 400000, and combinations thereof; and the pH is between 6 and 8; wherein PPG, PEG and PEO each independently has molecular weight (grams/mole) ranging from 10000 to 400000; and PEG and PPG blocks can be arranged in different orders; PEG/PPG molar ratios ranges from 1:99 to 99:1.

5. The polishing composition of claim 1, wherein the biocide ranges from 0.0001 wt. % to 0.03 wt. %.

* * * * *